(12) United States Patent
Yamada (10) Patent No.: US 9,299,637 B2
(45) Date of Patent: Mar. 29, 2016

(54) SEMICONDUCTOR MODULE (71) Applicant: FUJI ELECTRIC CO., LTD., Kawasaki-shi, Kanagawa (JP)

(72) Inventor: Takafumi Yamada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/878,596

(22) Filed: Oct. 8, 2015

(65) Prior Publication Data
US 2016/0027716 A1   Jan. 28, 2016

Related U.S. Application Data (63) Continuation of application No. PCT/JP2014/074484, filed on Sep. 17, 2014.

(30) Foreign Application Priority Data

Oct. 30, 2013   (JP) ................. 2013-225513

(51) Int. Cl.
H01L 23/48   (2006.01)
H01L 23/373   (2006.01)
H01L 23/498   (2006.01)
H01L 23/00   (2006.01)
H01L 23/367   (2006.01)

(52) U.S. Cl.
CPC ........ *H01L 23/3735* (2013.01); *H01L 23/3675* (2013.01); *H01L 23/49811* (2013.01); *H01L 23/49838* (2013.01); *H01L 24/32* (2013.01); *H01L 2224/29111* (2013.01); *H01L 2224/32225* (2013.01); *H01L 2924/014* (2013.01); *H01L 2924/01047* (2013.01); *H01L 2924/01051* (2013.01)

(58) Field of Classification Search
CPC ............... H01L 24/32; H01L 23/3735; H01L 23/49838; H01L 23/49811; H01L 23/3675
See application file for complete search history.

(56) References Cited

U.S. PATENT DOCUMENTS

2009/0246910 A1   10/2009   Taniguchi et al.
2012/0241953 A1   9/2012   Yamada et al.
2012/0292087 A1   11/2012   Ueshima et al.

FOREIGN PATENT DOCUMENTS

| JP | 2009-064852 A | 3/2009 |
| JP | 2009-231690 A | 10/2009 |
| JP | 2011-138968 A | 7/2011 |
| JP | 2013-89809 A | 5/2013 |
| JP | 2013-125804 A | 6/2013 |
| WO | 2011/083737 A1 | 7/2011 |

OTHER PUBLICATIONS

PCT, "International Search Report for International Application No. PCT/JP2014/074484".

*Primary Examiner* — Nicholas Tobergte
(74) *Attorney, Agent, or Firm* — Manabu Kanesaka (57) ABSTRACT

The semiconductor module includes a pin that is connected to a semiconductor element; a pin wiring substrate that has a second metal film and a first metal film on the upper and lower surfaces, the first metal film and the second metal film being electrically bonded to the pin; solder that bonds the pin and the semiconductor element; a DCB substrate that has a third metal film and a fourth metal film on the upper and lower surfaces, the third metal film being bonded to a lower surface of the semiconductor element; and a first cooler that is connected to the fourth metal film. The ratio H/T of a height H of the solder to a distance T from the semiconductor element to the first metal film is equal to or greater than 0.2 and equal to or less than 0.7.

6 Claims, 6 Drawing Sheets

SEMICONDUCTOR MODULE

CROSS-REFERENCES TO RELATED APPLICATIONS

The present application is a Continuation Application of PCT International Application No. PCT/JP2014/074484 filed Sep. 17, 2014, and claiming priority from Japanese Application No. 2013-225513 filed Oct. 30, 2013, the disclosure of which is incorporated herein.

TECHNICAL FIELD

The present invention relates to a semiconductor module which uses pin bonding and can improve cooling capacity.

BACKGROUND ART

The following Patent Documents 1 and 2 disclose a semiconductor module using pin bonding.

FIG. 1 of Patent Document 1 discloses a structure in which a semiconductor element is electrically bonded to an implant pin fixed to a printed circuit board.

FIGS. 7, 8, and 11 of Patent Document 2 discloses a structure in which a semiconductor element and a plurality of post electrodes are soldered to each other.

CITATION LIST

Patent Document

Patent Document 1: WO2011/083737
Patent Document 2: JP 2009-64852 A

DISCLOSURE OF THE INVENTION

Problem to be Solved by the Invention

Patent Documents 1 and 2 disclose the semiconductor module with the pin bonding structure which is considered as measures to suppress a detachment phenomenon between a wire frame and an electrode due to long-term use. However, the structure of the semiconductor module has the problem that cooling capacity is low since only one surface of the semiconductor element is cooled and it is difficult for the semiconductor element to sufficiently exhibit its performance.

The invention has been made in order to solve the above-mentioned problems and an object of the invention is to provide a semiconductor module which uses pin bonding and can improve cooling capacity.

Means for Solving Problem

The inventors found that by optimizing the thickness of solder for bonding a pin and a semiconductor element, the cooling capacity of a semiconductor module using pin bonding was improved. As a result, the invention was achieved.

In order to solve the above-mentioned problems, according to an embodiment of the invention, there is provided a semiconductor module including: a semiconductor element; a pin that is electrically and thermally connected to one surface of the semiconductor element; a pin wiring substrate that includes a pin wiring insulating substrate, a first metal film provided on a lower surface of the pin wiring insulating substrate, and a second metal film provided on an upper surface of the pin wiring insulating substrate, the first metal film and the second metal film being electrically bonded to the pin; solder that bonds the pin and the semiconductor element; a DCB substrate that includes a ceramic insulating substrate, a third metal film provided on an upper surface of the ceramic insulating substrate, and a fourth metal film provided on a lower surface of the ceramic insulating substrate, the third metal film being bonded to a lower surface of the semiconductor element; and a first cooler that is thermally connected to the fourth metal film. A ratio H/T of a height H of the solder to a distance T from the semiconductor element to the first metal film of the pin wiring insulating substrate is equal to or greater than 0.2 and equal to or less than 0.7.

In the semiconductor module according to the invention, a linear expansion coefficient of the solder may be less than 22.0 ppm/K.

In the semiconductor module according to the invention, the solder may be SnSb-based solder.

In the semiconductor module according to the invention, the SnSb-based solder may include 13 mass % of Sb as a main component.

In the semiconductor module according to the invention, the solder may be SnAg-based solder.

Effect of the Invention

According to the invention, heat generated from the semiconductor element is transferred to both the pin wiring substrate which is bonded to the front surface of the semiconductor element through the pin by soldering and the ceramic insulating substrate which is soldered to the rear surface of the semiconductor element. Therefore, it is possible to improve cooling capacity. Furthermore, in the pin bonding, the ratio (H/T) of the height H of the solder to the distance T from the semiconductor element to the first metal film is equal to or greater than 0.2 and equal to or less than 0.7. Therefore, the transient phenomenon of heat transfer is reduced by the heat storage effect of the solder and it is possible to suppress an increase in the temperature of the surface of the semiconductor element.

MODE(S) FOR CARRYING OUT THE INVENTION

Hereinafter, embodiments of a semiconductor module according to the invention will be described with reference to the drawings. The same components are denoted by the same reference numerals and the description thereof will not be repeated. The invention is not limited to the following embodiments and can be appropriately modified without departing from the scope and spirit of the invention.

First, the structure of the semiconductor module will be described.

Figure 1:
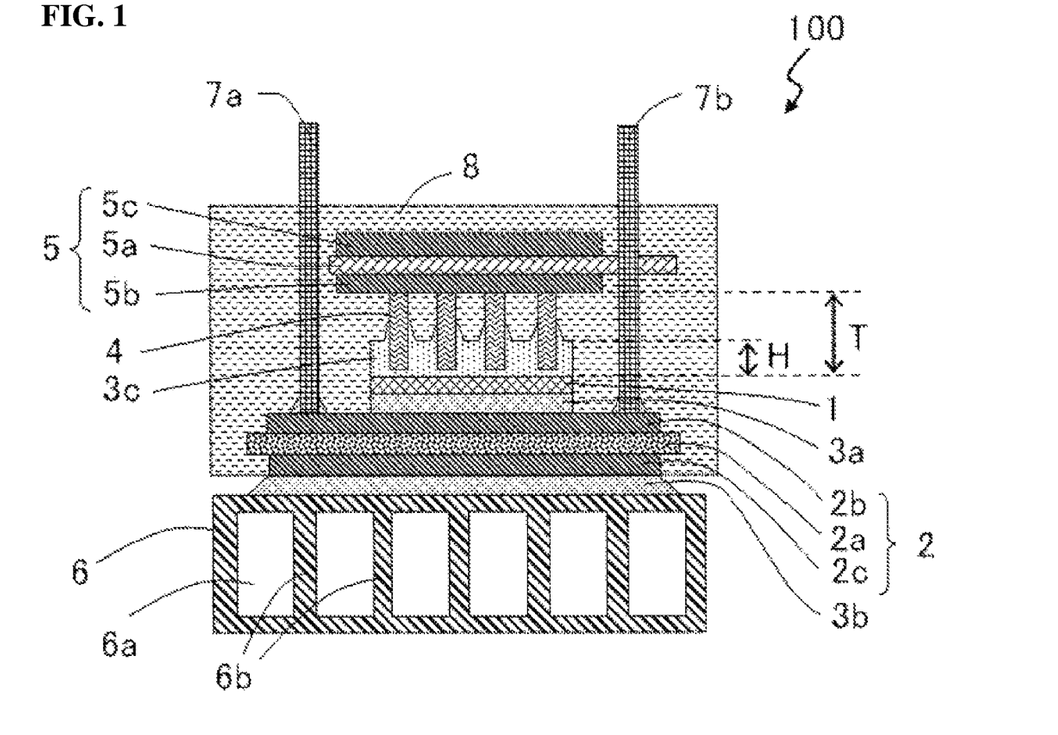
FIG. 1 is a cross-sectional view schematically illustrating a semiconductor module according to an embodiment of the invention.

FIG. 1 is a cross-sectional view schematically illustrating a semiconductor module 100 according to the invention. The semiconductor module 100 includes a semiconductor element 1, a DCB substrate 2, a ceramic insulating substrate 2a, a third metal film 2b, a fourth metal film 2c, solder 3a, solder 3b, solder 3c, pins 4, a pin wiring substrate 5, a pin wiring insulating substrate 5a, a first metal film (circuit layer) 5b, a second metal film 5c, a first cooler 6, a first cooling medium path 6a, fins 6b, an external terminal 7a, an external terminal 7b, and a sealing resin 8.

The semiconductor element 1 is not particularly limited. For example, the semiconductor element 1 may be an insulated gate bipolar transistor (IGBT), a power metal oxide semiconductor field effect transistor (MOSFET), or a free wheeling diode (FWD). Alternatively, the semiconductor element 1 may be a reverse blocking-insulated gate bipolar transistor (RB-IGBT) or a reverse conducting-insulated gate bipolar transistor (RC-IGBT) which is obtained by forming the transistors and the diode in one semiconductor element in the vertical direction.

The pin wiring substrate 5 includes the pin wiring insulating substrate 5a, the first metal film (circuit layer) 5b, and the second metal film 5c. The first metal film (circuit layer) 5b is provided so as to face the semiconductor element 1. The material forming the pin wiring insulating substrate 5a is not particularly limited. However, the pin wiring insulating substrate 5a is preferably made of a material with high permittivity and high thermal conductivity. For example, the pin wiring insulating substrate 5a can be made of a polyimide resin or a glass epoxy resin. The pin wiring substrate 5 is not necessarily a printed circuit board and may be, for example, a thin copper plate. The materials forming the first metal film (circuit layer) 5b and the second metal film 5c are not particularly limited. The first metal film (circuit layer) 5b and the second metal film 5c are preferably made of a material with low electric resistance and high thermal conductivity. For example, the first and second metal films can be made of copper.

The material forming the pin 4 is not particularly limited. The pin 4 is made of a metal material with low electric resistance and high thermal conductivity. Specifically, the pin 4 is preferably made of copper. One end of the pin 4 is bonded to the upper surface of the semiconductor element 1 by the solder 3c and the other end thereof passes through the pin wiring substrate 5 and is bonded to the first metal film (circuit layer) 5b and the second metal film 5c. According to the above-mentioned structure, the pin 4 can be firmly fixed to the semiconductor element 1 and the pin wiring substrate 5 and heat generated from the semiconductor element 1 can be transferred to the second metal film 5c through the pin 4. Therefore, it is possible to improve the cooling efficiency of the semiconductor module 100. In addition, it is preferable that a plurality of pins 4 be provided for one semiconductor element 1. In this case, it is possible to reduce electric resistance and to improve thermal conductivity.

The first cooler 6 is hollow and includes a plurality of fins 6b. The cooling medium path 6a is formed between the fins 6b. A cooling medium is not particularly limited. For example, the following cooling media may be used: a liquid cooling medium such as an ethylene glycol solution or water; a gas cooling medium such as air; and a phase-changeable cooling medium, such as chlorofluorocarbon, which is evaporated by a cooler and cools the cooler with evaporation heat.

The DCB substrate 2 includes the ceramic insulating substrate 2a, the third metal film 2b, and the fourth metal film 2c. The third metal film 2b is provided on the upper surface of the ceramic insulating substrate 2a and the fourth metal film 2c is provided on the lower surface of the ceramic insulating substrate 2a. The third metal film 2b of the DCB substrate 2 is bonded to the lower surface of the semiconductor element 1. The DCB is an abbreviation of direct copper bonding. In the DCB, a metal film, such as a copper film, is directly bonded to a ceramic insulating substrate. Since the ceramic insulating substrate 2a has an insulation property, the third metal film 2b and the fourth metal film 2c are electrically insulated from each other. The material forming the ceramic insulating substrate 2a is not particularly limited. The ceramic insulating substrate 2a is preferably made of a material with high thermal conductivity. For example, the ceramic insulating substrate 2a can be made of $Si_3N_4$, AlN, or $Al_2O_3$.

The solder 3a electrically and thermally connects the lower surface of the semiconductor element 1 and the third metal film 2b. The solder 3b connects the fourth metal film 2c of the DCB substrate 2 and the outer wall of the first cooler 6 and transmits heat, which has been transferred from the semiconductor element 1 to the DCB substrate 2, to the first cooler 6.

The external terminals 7a and 7b are used to connect the semiconductor element 1 to the outside. Main power is transmitted through the external terminals 7a and 7b. The external terminals 7a and 7b are electrically connected to the third metal film 2b of the DCB substrate 2 by solder and extend from the upper surface to the outside. The semiconductor module 100 includes control terminals (not illustrated). The control terminals are used to control the semiconductor element 1. The semiconductor element 1 is controlled from the outside through the control terminals.

The semiconductor module 100 is sealed with the sealing resin 8 except for a bonding surface between the first cooler 6 and the fourth metal film 2c of the first cooler 6, regions of the external terminals 7a and 7b which extend to the outside, and regions of the control terminals (not illustrated) which extend to the outside. The sealing resin 8 is not particularly limited as long as it has a predetermined insulation performance and is easy to mold. For example, an epoxy resin is preferably used as the sealing resin 8.

The semiconductor module illustrated in FIG. 1 includes only one semiconductor element. However, the semiconductor module may include a plurality of sets of the semiconductor element 1a and the pins 4. When a plurality of semiconductor elements is connected in parallel to each other, it is possible to increase a rated output which can be processed by the semiconductor module. In addition, a plurality of semiconductor elements 1 may be different types. For example, an IGBT and an FWD may be connected in parallel to each other.

Next, the detailed structure, operation, and effect of a bonding portion between the semiconductor element 1 and the pin 4 will be described.

The pin 4 is bonded to the upper surface of the semiconductor element 1 by the solder 3c. A gap is provided between the surface of the solder 3c and the first metal film (circuit layer) 5b of the pin wiring substrate 5.

Here, it is assumed that the height of the solder is H and the distance from the semiconductor element to the first metal film of the pin wiring insulating substrate is T. In some cases, solder rises along the pin at the end of the interface between the pin and the solder. The height H of the solder is the height from the interface between the semiconductor element and the solder to the lowest surface of an upper portion of the solder. When a plurality of pins is provided, the height H of the solder is the height from the interface between the semiconductor element and the solder to the lowest surface of an upper portion of the solder between the pin and the pin.

In the semiconductor module according to the invention, it is preferable that the ratio H/T of the height H of the solder to the distance T from the semiconductor element to the first metal film of the pin wiring insulating substrate be equal to or greater than 0.2 and equal to or less than 0.7. When the ratio H/T is less than 0.2, the heat storage effect of the solder in a transient heat state is not sufficient and the maximum temperature Tj of the semiconductor element is out of a safety temperature range. When the ratio is greater than 0.7, stress applied to the semiconductor element is too large and the semiconductor element is broken in a high-temperature operation test or a thermal cycle test.

According to the above-mentioned structure, since the ratio H/T of the height H of the solder to the distance T from the semiconductor element to the first metal film of the pin wiring insulating substrate is equal to or greater than 0.2 and equal to or less than 0.7, it is possible to reduce the maximum temperature Tj of the semiconductor element in the transient heat state using the heat storage effect of the solder and to reduce stress applied to the semiconductor element.

In the above-mentioned semiconductor module, it is preferable that the ratio H/T be equal to or greater than 0.26 and equal to or less than 0.53. According to this structure, it is possible to further improve the cooling capacity of the semiconductor module, to reduce stress applied to the semiconductor element, and to increase the lifespan of the semiconductor module.

In the above-mentioned semiconductor module, it is preferable that the linear expansion coefficient of the solder be less than 22.0 ppm/K. In addition, it is more preferable that the linear expansion coefficient of the solder is equal to or less than 21.2 ppm/K. When the linear expansion coefficient of the solder is equal to or greater than 22.0 ppm/K and the semiconductor element is heated, thermal stress occurs due to the difference between the linear expansion coefficients of the pin and the solder and is likely to be applied to the semiconductor element.

According to this structure, the linear expansion coefficient of the solder can be close to the linear expansion coefficient of the pin and it is possible to reduce thermal stress applied to the semiconductor element. The material forming the pin is not particularly limited as long as it is metal which has high thermal conductivity and a linear expansion coefficient close to that of the solder. It is preferable that the pin be made of copper with high thermal conductivity. Specifically, it is preferable to use SnSb-based solder or SnAg-based solder as the solder. It is preferable that the SnSb-based solder have $Sn_{13}Sb$ as a main component. Since the $Sn_{13}Sb$ solder has a linear expansion coefficient of 21.2 ppm/K or less, it is possible to reduce thermal stress applied to the semiconductor element.

The operation and effect of the invention can be verified by a thermal simulation and a thermal stress simulation. Next, the simulation result of the semiconductor module illustrated in FIG. 1 will be described.

Figure 2:
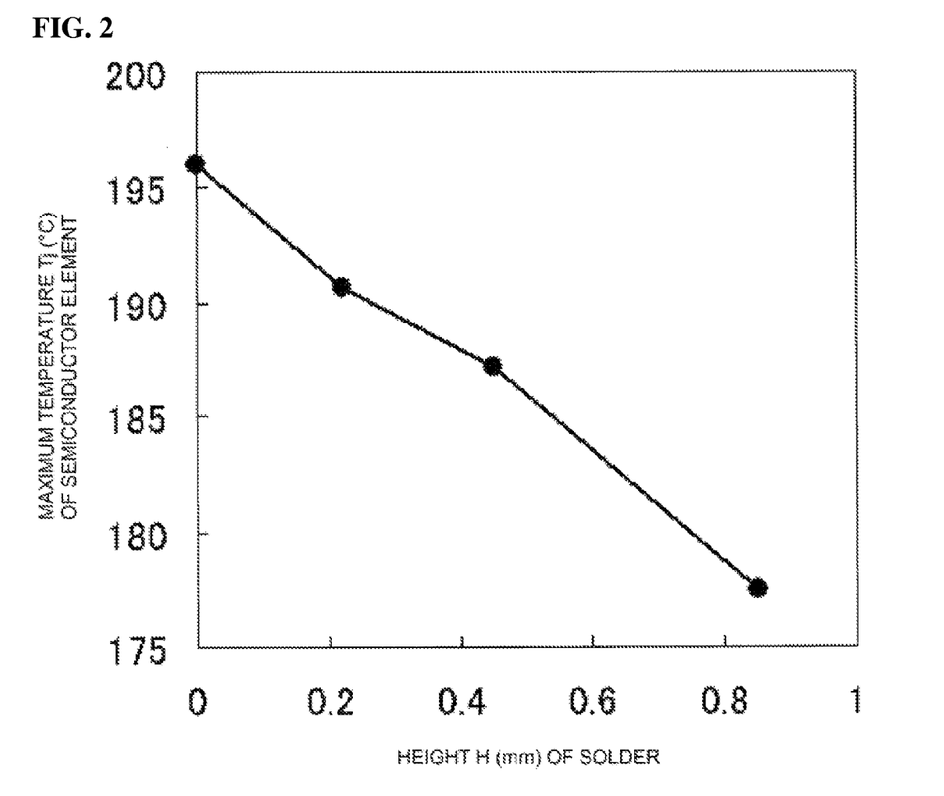
FIG. 2 is a diagram illustrating the relationship between the height of solder and the maximum temperature Tj of a semiconductor element.

FIG. 2 illustrates the relationship between the height H of the solder and the maximum temperature Tj of the semiconductor element. As can be seen from FIG. 2, the maximum temperature Tj of the semiconductor element during the operation of the semiconductor element 1 is reduced as the height H of the solder increases.

Figure 3:
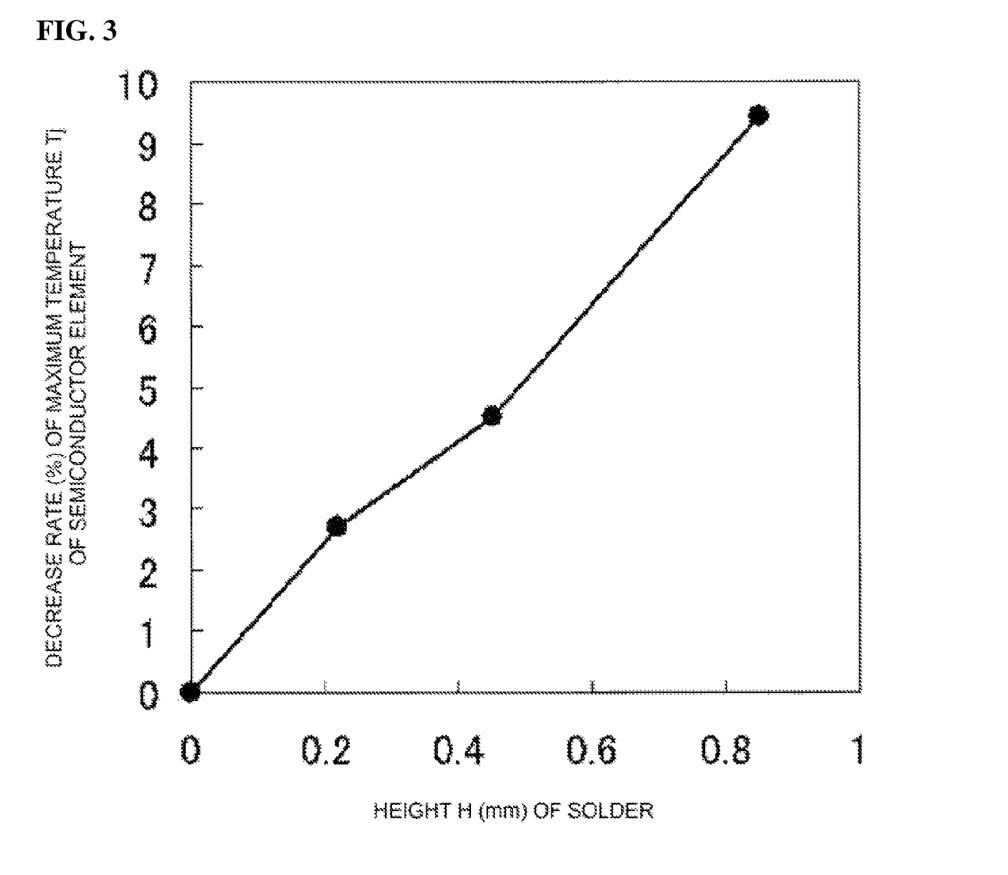
FIG. 3 is a diagram illustrating the relationship between the height of the solder and the rate of decrease in the maximum temperature Tj of the semiconductor element.

FIG. 3 is a diagram illustrating the relationship between the height of the solder and the rate of decrease in the maximum temperature Tj of the semiconductor element, which is obtained by converting the result illustrated in FIG. 2. As can be seen from FIG. 3, the temperature is reduced by a maximum of 9% when the height H of the solder increases.

Figure 4:
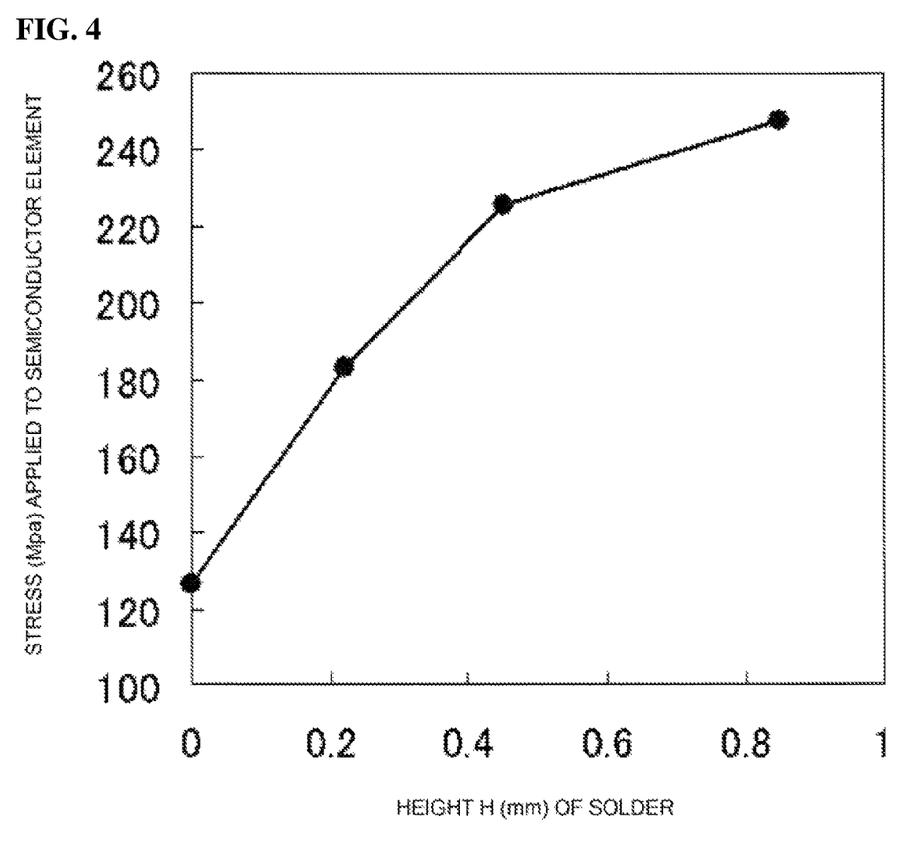
FIG. 4 is a diagram illustrating the relationship between the height of the solder and stress applied to the semiconductor element.

FIG. 4 is a diagram illustrating the relationship between the height H of the solder and stress applied to the semiconductor element 1. As can be seen from FIG. 4, when the height H of the solder increases, chip stress increases and is greater than 240 MPa.

Figure 5:
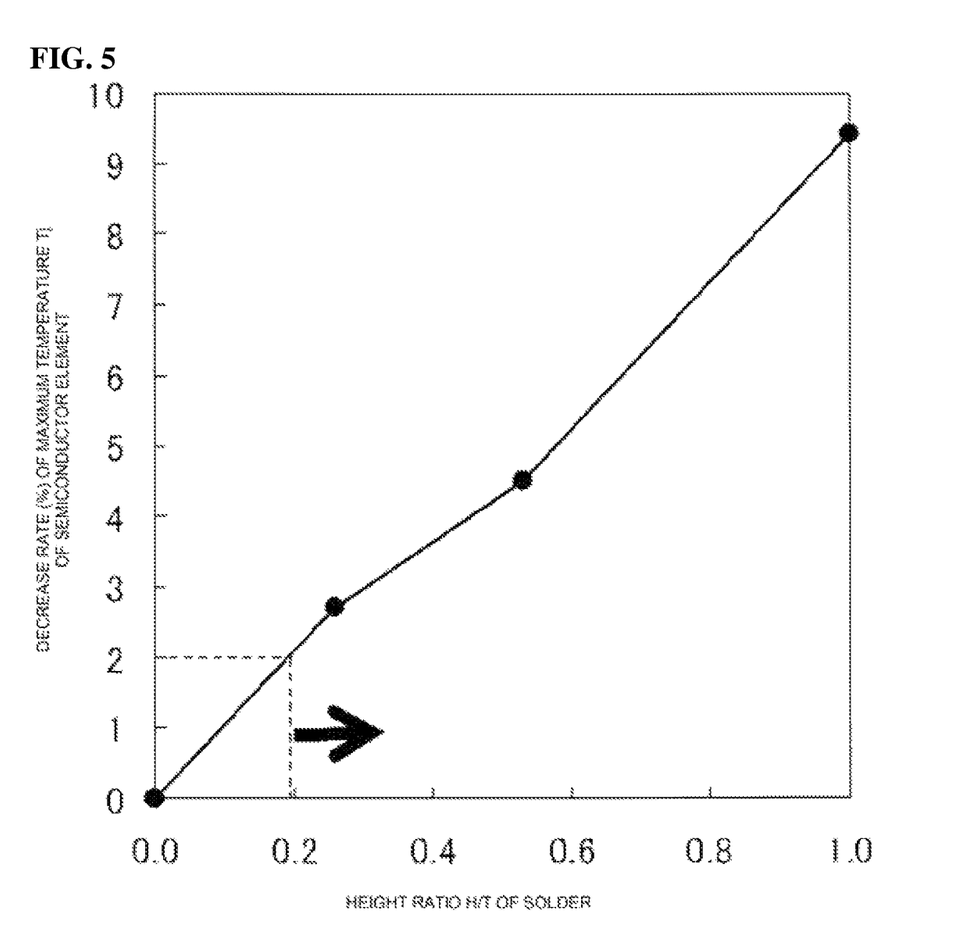
FIG. 5 is a diagram illustrating the relationship between the height ratio of the solder and the rate of decrease in the maximum temperature Tj of the semiconductor element.
Figure 6:
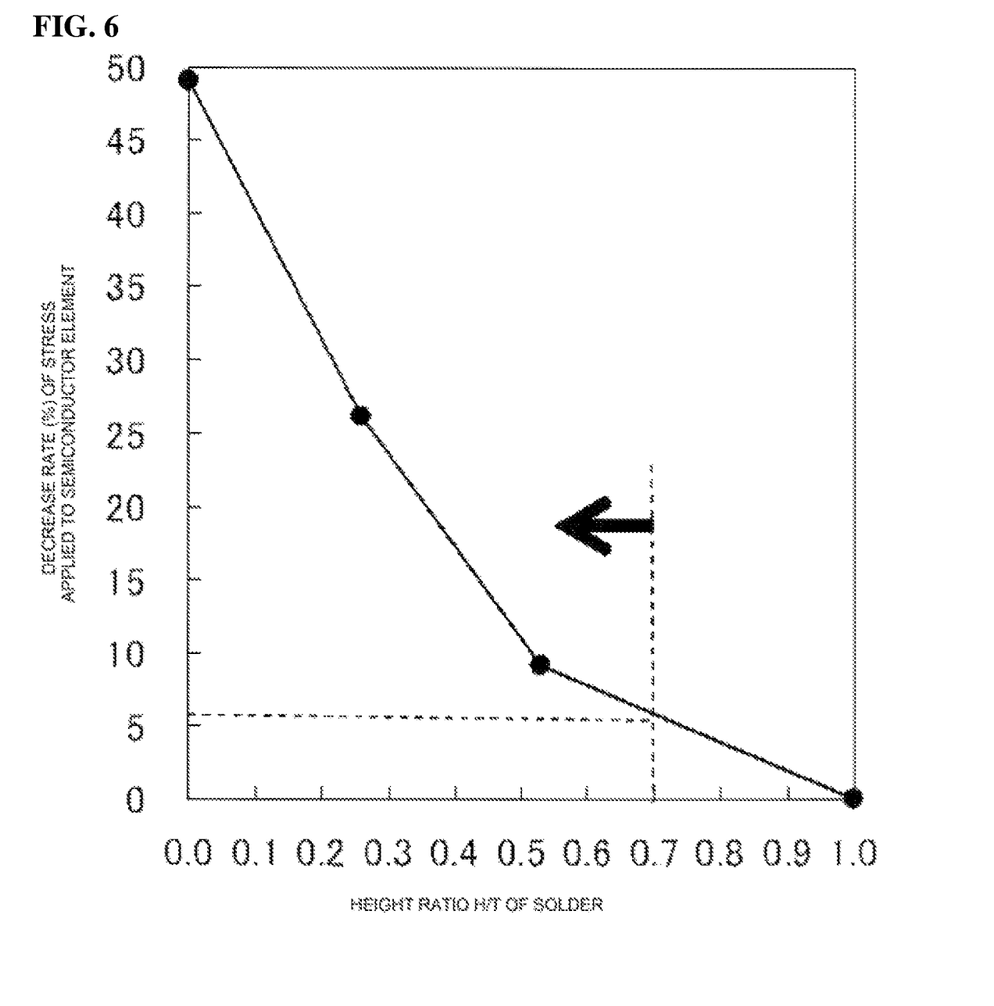
FIG. 6 is a diagram illustrating the relationship between the height ratio of the solder and the rate of decrease in stress applied to the semiconductor element.

FIG. 5 is a diagram illustrating the relationship between the height ratio H/T of the solder and the rate of decrease in the maximum temperature Tj of the semiconductor element. FIG. 6 is a diagram illustrating the relationship between the height ratio H/T of the solder and the rate of decrease in stress applied to the semiconductor element 1. When the height ratio H/T of the solder is equal to or greater than 0.2, the maximum temperature Tj of the semiconductor element can be reduced by 2% or more and the safety temperature range can be extended by 4° C. In addition, when the height ratio H/T of the solder is equal to or less than 0.7, stress can be reduced by 6% or more and a failure rate is improved in the high-temperature operation test.

As described above, according to the embodiment of the invention, it is possible to provide a semiconductor module which uses pin bonding and can improve cooling capacity.

EXPLANATIONS OF LETTERS OR NUMERALS

1 Semiconductor Element
2 DCB Substitute
2a Ceramic Insulating Substrate
2b Third Metal Film
2c Fourth Metal Film
3a, 3b, 3c Solar
4 Pin
5 Pin Wiring Substrate
5a Pin Wiring Insulating Substrate
5b First Metal Film (Circuit Layer)
5c Second Metal Film
6 First Cooler
6a First Cooling Medium Path
6b Fin
7a, 7b External Terminal
8 Sealing Resin
100 Semiconductor Module

What is claimed is:
1. A semiconductor module comprising:
  a semiconductor element;
  a pin electrically and thermally connected to an upper surface of the semiconductor element;
  a pin wiring substrate including a pin wiring insulating substrate, a first metal film provided on a lower surface of the pin wiring insulating substrate, and a second metal film provided on an upper surface of the pin wiring insulating substrate, the first metal film and the second metal film being electrically bonded to the pin;
  solder bonding the pin and the semiconductor element;
  a DCB substrate including a ceramic insulating substrate, a third metal film bonded to a lower surface of the semiconductor element and provided on an upper surface of the ceramic insulating substrate, and a fourth metal film provided on a lower surface of the ceramic insulating substrate; and
  a first cooler thermally connected to the fourth metal film, wherein a ratio H/T of a height H of the solder to a distance T from the semiconductor element to the first metal film of the pin wiring insulating substrate is equal to or greater than 0.2 and equal to or less than 0.7.

2. The semiconductor module according to claim 1, wherein the pin includes a plurality of pin members connected to the semiconductor element through the solder, and
the height H of the solder is the height from an interface between the semiconductor element and the solder to a lowest surface of an upper portion of the solder between the plurality of pins.

3. The semiconductor module according to claim 1, wherein a linear expansion coefficient of the solder is less than 22.0 ppm/K.

4. The semiconductor module according to claim 1, wherein the solder is SnSb-based solder.

5. The semiconductor module according to claim 4, wherein the SnSb-based solder includes 13 mass % of Sb as a main component.

6. The semiconductor module according to claim 1, wherein the solder is SnAg-based solder.

* * * * *